(12) United States Patent
Hua et al.

(10) Patent No.: US 7,159,597 B2
(45) Date of Patent: Jan. 9, 2007

(54) MULTISTEP REMOTE PLASMA CLEAN PROCESS

(75) Inventors: Zhong Qiang Hua, Saratoga, CA (US); Zhengquan Tan, Cupertino, CA (US); Zhuang Li, San Jose, CA (US); Kent Rossman, Orlando, FL (US)

(73) Assignee: Applied Materials, Inc., Santa Clara, CA (US)

( * ) Notice: Subject to any disclaimer, the term of this patent is extended or adjusted under 35 U.S.C. 154(b) by 259 days.

(21) Appl. No.: 10/153,315

(22) Filed: May 21, 2002

(65) Prior Publication Data

US 2003/0029475 A1 Feb. 13, 2003

Related U.S. Application Data

(60) Provisional application No. 60/295,341, filed on Jun. 1, 2001.

(51) Int. Cl.
*B08B 7/04* (2006.01)

(52) U.S. Cl. .................... 134/1.1; 134/22.1; 134/30; 438/905

(58) Field of Classification Search .................... 134/1, 134/1.1, 22.1, 22.18, 26, 30, 37; 438/905
See application file for complete search history.

(56) References Cited

U.S. PATENT DOCUMENTS

| 4,138,306 A | 2/1979 | Niwa |
| 4,563,367 A | 1/1986 | Sherman |
| 4,910,042 A | 3/1990 | Hokynar |
| 4,913,929 A | 4/1990 | Moslehi et al. |
| 4,988,644 A | 1/1991 | Jucha et al. |
| 5,000,113 A | 3/1991 | Wang et al. |
| 5,158,644 A | 10/1992 | Cheung et al. |
| 5,346,579 A | 9/1994 | Cook et al. |
| 5,350,480 A | 9/1994 | Gray |
| 5,403,434 A | 4/1995 | Moslehi |
| 5,662,770 A | 9/1997 | Donohoe |
| 5,688,357 A | 11/1997 | Hanawa |
| 5,770,098 A | 6/1998 | Araki et al. |
| 5,788,778 A | 8/1998 | Shang et al. |
| 5,792,272 A | 8/1998 | van Os et al. |
| 5,812,403 A | 9/1998 | Fong et al. |
| 5,843,239 A * | 12/1998 | Shrotriya .................... 134/1.1 |
| 5,844,195 A | 12/1998 | Fairbairn et al. |

(Continued)

FOREIGN PATENT DOCUMENTS

DE 4132559 4/1993

(Continued)

OTHER PUBLICATIONS

Grill, Alfred, "Cold Plasma in Materials Fabrication", IEEE Press, 1994, pp. 109-110, 160-163.

*Primary Examiner*—Alexander Markoff
(74) *Attorney, Agent, or Firm*—Townsend and Townsend and Crew LLP

(57) ABSTRACT

A process for removing unwanted deposition build-up from one or more interior surfaces of a substrate processing chamber after depositing a layer of material over a substrate disposed in the chamber. In one embodiment the process comprises transferring the substrate out of the chamber; flowing a first gas into the substrate processing chamber and forming a plasma within the chamber from the first gas in order to heat the chamber; and thereafter, extinguishing the plasma, flowing an etchant gas into a remote plasma source, forming reactive species from the etchant gas and transporting the reactive species into the substrate processing chamber to etch the unwanted deposition build-up.

23 Claims, 8 Drawing Sheets

U.S. PATENT DOCUMENTS

| | | | |
|---|---|---|---|
| 5,939,831 A | 8/1999 | Fong et al. | |
| 5,942,804 A | 8/1999 | Mohwinkel et al. | |
| 6,039,834 A | 3/2000 | Tanaka et al. | |
| 6,055,927 A * | 5/2000 | Shang et al. | 118/723 ME |
| 6,060,400 A | 5/2000 | Oehrlein et al. | |
| 6,109,206 A | 8/2000 | Maydan et al. | |
| 6,125,859 A * | 10/2000 | Kao et al. | 134/1.1 |
| 6,148,832 A | 11/2000 | Gilmer et al. | |
| 6,170,428 B1 | 1/2001 | Redeker et al. | |
| 6,182,602 B1 | 2/2001 | Redeker et al. | |
| 6,217,951 B1 | 4/2001 | Mizuno et al. | |
| 6,255,222 B1 * | 7/2001 | Xia et al. | 438/710 |
| 6,274,058 B1 * | 8/2001 | Rajagopalan et al. | 216/67 |
| 6,329,297 B1 | 12/2001 | Balish et al. | |
| 6,379,575 B1 * | 4/2002 | Yin et al. | 216/67 |
| 6,387,207 B1 | 5/2002 | Janakiraman et al. | |
| 6,418,874 B1 * | 7/2002 | Cox et al. | 118/723 I |
| 6,435,197 B1 * | 8/2002 | Shin et al. | 134/1.1 |
| 6,450,117 B1 * | 9/2002 | Murugesh et al. | 118/723 ME |
| 6,584,987 B1 * | 7/2003 | Cheng et al. | 134/1.1 |
| 2002/0020429 A1 * | 2/2002 | Selbrede et al. | 134/1.1 |
| 2002/0033183 A1 * | 3/2002 | Sun et al. | 134/1.1 |

FOREIGN PATENT DOCUMENTS

| | | |
|---|---|---|
| EP | 0537950 | 4/1993 |
| EP | 0552491 | 7/1993 |
| EP | 0697467 | 2/1996 |
| JP | 1-220434 | 9/1989 |
| JP | 2-125876 | 5/1990 |
| WO | WO 97/03223 | 1/1997 |
| WO | WO 99/02754 | 1/1999 |
| WO | WO 99/03312 | 1/1999 |

* cited by examiner

MULTISTEP REMOTE PLASMA CLEAN PROCESS

CROSS-REFERENCES TO RELATED APPLICATIONS

This application claims the benefit of U.S. Provisional Application No. 60/295,341, filed Jun. 1, 2001, which is incorporated herein by reference.

BACKGROUND OF THE INVENTION

One of the primary steps in the fabrication of modern semiconductor devices is the formation of a layer, such as a silicon oxide layer, on a substrate or wafer. As is well known, such a layer can be deposited by chemical vapor deposition (CVD). In a conventional thermal CVD process, reactive gases are supplied to the substrate surface where heat-induced chemical reactions take place to form the desired film. In a conventional plasma CVD process, a controlled plasma is formed using, for example, radio frequency (RF) energy or microwave energy to decompose and/or energize reactive species in reactant gases to produce the desired film.

Unwanted deposition on areas such as the walls of the processing chamber also occurs during such CVD processes. As is known in the industry, it is common to remove the unwanted deposition material that builds up on the interior of chamber walls with an in situ chamber clean operation. Common chamber cleaning techniques include the use of an etchant gas, such as fluorine, to remove the deposited material from the chamber walls and other areas. In some processes, the etchant gas is introduced into the chamber and a plasma is formed so that the etchant gas reacts with and removes the deposited material from the chamber walls. Such cleaning procedures are commonly performed between deposition steps for every wafer or every n wafers.

Some semiconductor manufactures employ a remote plasma cleaning process as an alternative to an in situ plasma cleaning, a remote plasma cleaning procedure may be employed in which an etchant plasma is generated remote from the substrate processing chamber by a high density plasma source such as a microwave plasma system, toroidal plasma generator or similar device. Dissociated species from the etchant plasma are then transported to the substrate processing chamber where they can react with and etch away the undesired deposition build up. Remote plasma cleaning procedures are sometimes used by manufacturers because they provide a "softer" etch than in situ plasma cleans, i.e., there is less ion bombardment and/or physical damage to chamber components because the plasma is not in contact with chamber components.

One problem with some remote plasma cleaning processes, however, is that they require a higher volume of etchant gas than is required by some in situ cleaning processes. Accordingly, improvements to remote plasma cleaning processes are desirable.

BRIEF SUMMARY OF THE INVENTION

Embodiments of the invention pertain to techniques for removing unwanted deposition build-up from one or more interior surfaces of a substrate processing chamber after a substrate is processed in the chamber by, for example, depositing a layer of material over the substrate. Embodiments of the invention use a reduced amount of etchant gas as compared to some remote plasma cleaning processes.

In accordance with one embodiment, a process for removing unwanted deposition build-up from one or more interior surfaces of a substrate processing chamber is provided. First, a substrate processed within the chamber is transferred out of the chamber; Next, a first gas is introduced into the substrate processing chamber and an in situ plasma is formed within the chamber from the first gas in order to heat the chamber. Once the chamber reaches a predetermined temperature or a predetermined period of time elapses, the plasma is extinguished and an etchant gas is introduced into a remote plasma source fluidly coupled to the chamber. Reactive species are formed within the remote plasma source from the etchant gas and transported into the substrate processing chamber to etch the unwanted deposition build-up.

In accordance with another embodiment, a process for removing unwanted deposition build-up from one or more interior surfaces of a substrate processing chamber after a layer of material is deposited over a substrate disposed in the substrate processing chamber is provided. The process includes transferring the substrate out of the chamber; flowing an inert gas into the substrate processing chamber; forming a plasma from the inert gas within the substrate processing chamber to heat the chamber; thereafter, extinguishing the plasma, flowing an etchant gas into a remote plasma source at a first flow rate, forming reactive species from the etchant gas and transporting the reactive species into the substrate processing chamber to etch a first portion of the unwanted deposition build-up; and thereafter, decreasing the flow rate of the etchant gas into the remote plasma source while continuing to transport reactive species formed from the etchant gas into the substrate processing chamber to etch a second portion of the unwanted deposition build-up.

These and other embodiments of the invention along with many of its advantages and features are described in more detail in conjunction with the text below and attached figures.

DETAILED DESCRIPTION OF THE INVENTION

Figure 1A:
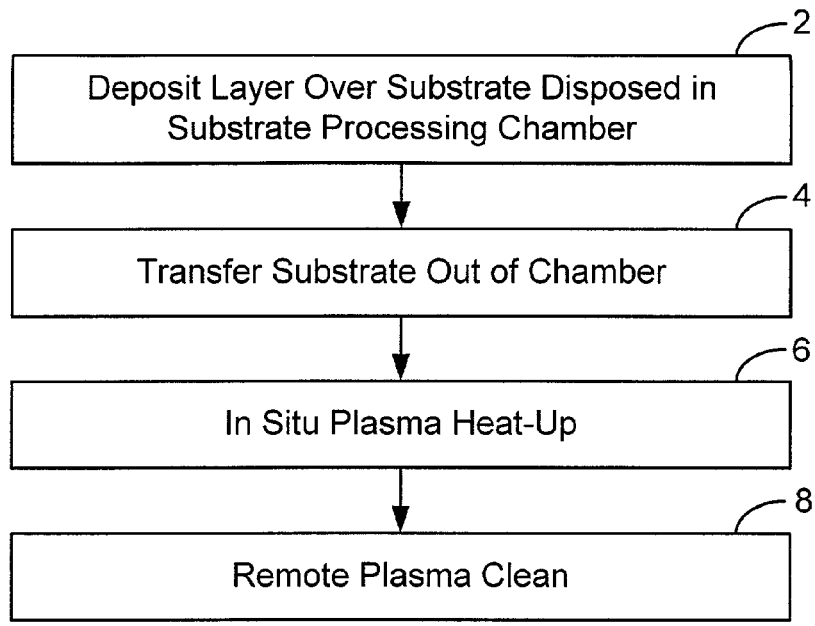
FIG. 1A is a flowchart depicting the steps associated with one embodiment of the present invention.

Embodiments of the present invention provide for an improved remote plasma cleaning process. FIG. 1A is a flow chart depicting the steps according one embodiment of the present invention. As shown in FIG. 1A, after a substrate deposition process or other type of substrate processing step (step 2) occurs in a substrate processing chamber, the substrate is transferred out of the chamber (step 4) and an in situ plasma is formed from a gas such as argon (step 6). The in situ plasma heats the substrate processing chamber (in some embodiments to a temperature above the deposition temperature used in the previous deposition step) prior to employing a remote plasma clean process. Once the chamber is heated to an appropriate temperature (e.g., above 400° C. in some embodiments), the in situ plasma is stopped and remotely dissociated species, such as fluorine-free radicals and other excited fluorine species, are transported into the chamber to etch the unwanted deposition build up from the chamber's interior (step 8). In other embodiments the plasma is stopped after a predetermined amount of time has elapsed.

The inventors have found that the addition of such an in situ plasma heat-up step prior to a remote plasma clean enhances the efficiency of the remote clean without sacrificing any of the desirable benefits achieved by such a "soft" clean. As a result, etchant gas usage (e.g., $NF_3$) can be reduced significantly from the levels that may otherwise be required in a remote clean process to remove the same amount of deposition build-up.

In one embodiment implemented in an Ultima HDP-CVD chamber manufactured by Applied Materials and outfitted from 200 mm wafers, in situ plasma preheating step 6 flows argon into the chamber at a flow rate of 40 sccm while the chamber is maintained at a pressure of about 5 mTorr. A plasma is formed from the argon by applying 3500 Watts of RF energy to the top coil and 4800 Watts of RF energy to the side coil. RF bias power is not employed and the plasma is maintained for 30 seconds to heat the chamber. In some specific embodiments the following conditions are employed: an argon flow rate of between 20–400 sccm, a chamber pressure between 2–10 mTorr, top coil RF energy of between 1200–5000 Watts, side coil RF energy of between 3500–5000 Watts and a length of between 20–60 seconds. These ranges are for exemplary purposes only, however, and other embodiments may use values outside of these ranges or may use different parameters altogether. Also, inert gases other than argon can be used in other embodiments and in some other embodiments molecular oxygen or a similar oxygen source may be added to the argon or other inert gas flow or used in lieu of the inert gas.

Figure 2:
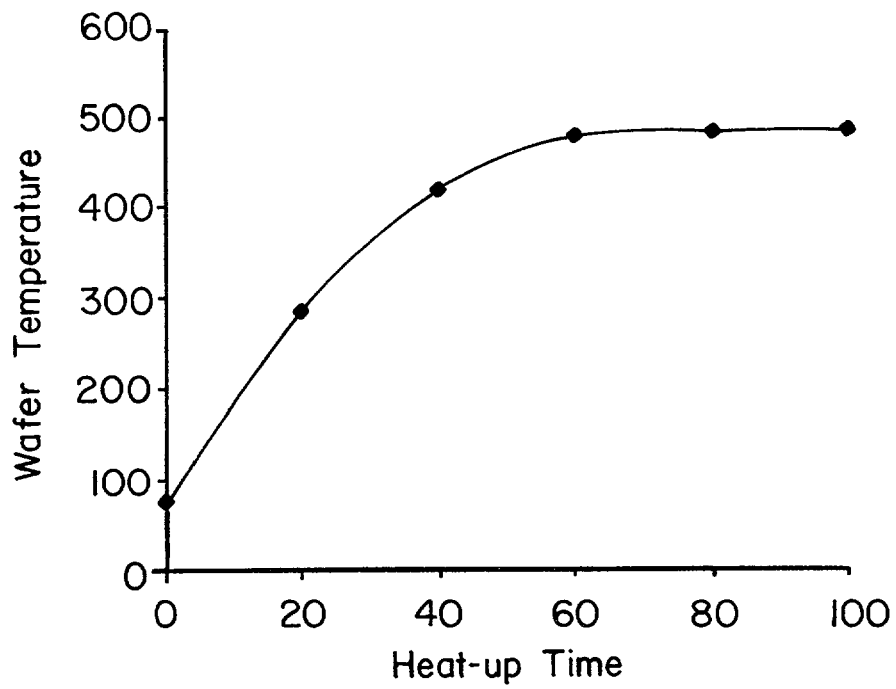
FIG. 2 is a graph illustrating the increase in chamber temperature associated with increases in the duration of step 6 shown in FIGS. 1A and 1B.

As previously mentioned, the in situ plasma heat-up step provides a highly effective heat source to increase the surface temperature on which the chemical reaction associated with the remote clean takes place. FIG. 2 shows the effect on chamber temperature as the heat up step proceeds.

As shown in FIG. 2, the temperature of a test silicon substrate (chucked to the pedestal and not cooled using a backside cooling technique) rises quickly during the first 60 seconds of the heat-up step until it reaches a near maximum value. The actual substrate temperature, as well as its rate of increase, will depend on the characteristics of the plasma, such as the amount of ion bombardment and the RF power levels employed, as a person of skill in the art will appreciate.

Figure 3:
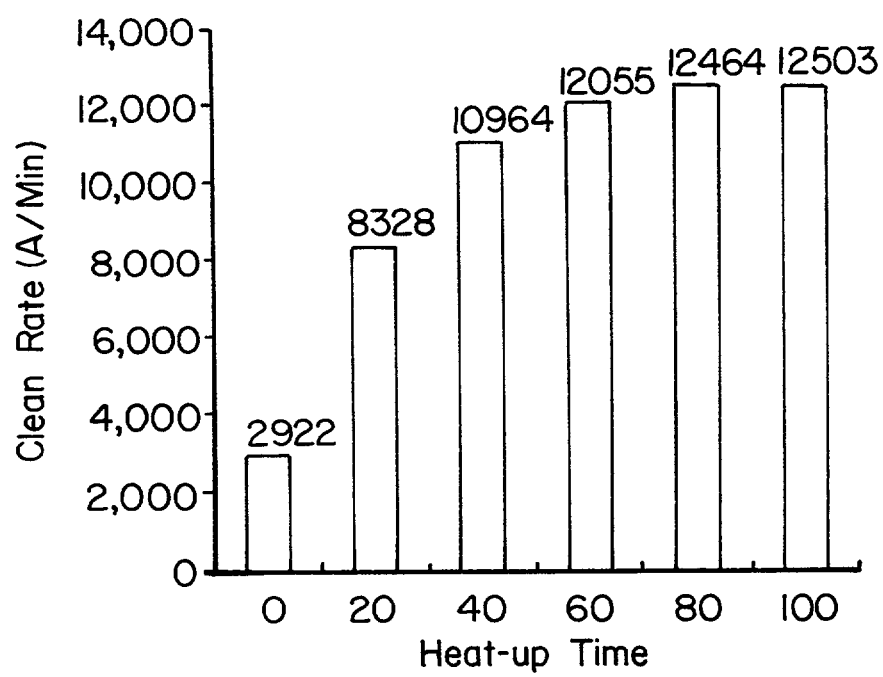
FIG. 3 is a graph illustrating the increase in the clean rate of a remote plasma clean process executed after increasingly long in situ plasma heat-up steps.

FIG. 3 shows that as the chamber temperature increases due to longer in situ plasma heat-up steps, the clean rate of the subsequent remote plasma step also increases. An additional benefit achieved by the in situ plasma heat-up step is that sputtering generated from the argon onto oxide surfaces, such as unwanted silicon oxide deposition, may physically excite the uppermost layer of the oxide on both microscopic (i.e., surface roughness) and macroscopic (i.e., film stress and surface tension) levels, both of which promote the surface chemical reaction in large.

During the remote clean reaction itself, the temperature of the chamber decreases from the temperature reached in the in situ plasma heat-up step to a lower temperature. This decrease in temperature effects the mechanisms that drives the clean reaction. This concept is illustrated in FIG. 4, which is a graph depicting the temperature of the chamber interior (measured at the pedestal) as a function of time during an exemplary remote plasma clean process.

Figure 4:
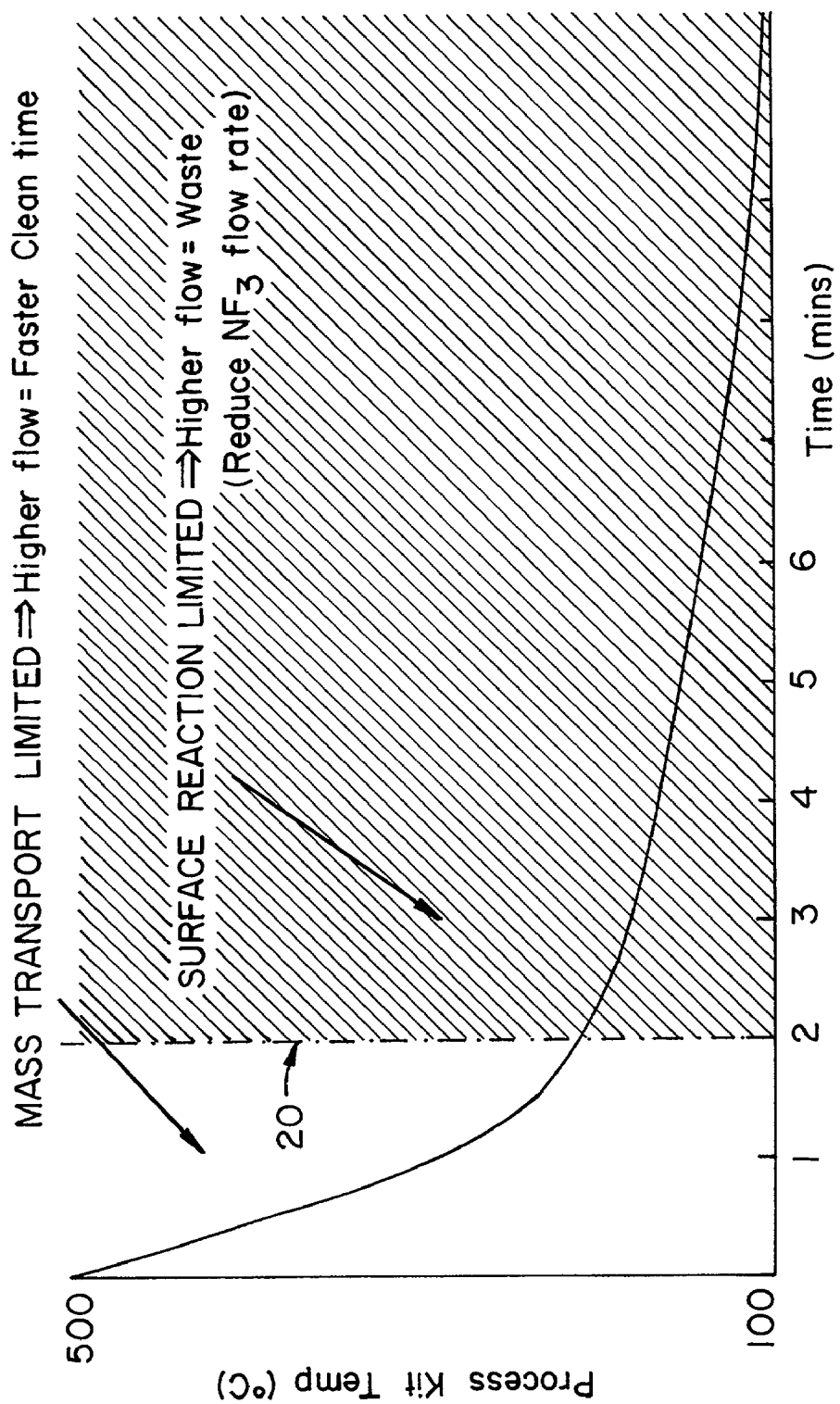
FIG. 4 is a graph depicting the decrease in chamber temperature during the course of a remote plasma chamber clean process.

As shown in FIG. 4, the temperature of the interior surfaces declines from an initial temperature of about 500° C. to a final temperature of about 100° C. during the course of the exemplary 10 minute remote plasma clean step. During the initial portion of the remote plasma clean process when the chamber is at relatively high temperature, the chamber clean reaction is mass transport limited and thus higher clean gas flow rates generally result in faster clean times. As the temperature of the chamber decreases, however, the rate of the chamber clean step becomes surface reaction limited. Thus, higher clean gas rate flow rates do not correspond to higher clean rates.

The dividing line between a mass transport limited reaction and a surface reaction limited reaction is approximated in FIG. 4 as time 20. It is to be understood that the temperature and time values set forth in FIG. 4, including dividing time 20, are for exemplary purposes only. Actual temperatures, remote plasma clean times and dividing lines between the reaction mechanisms will differ depending on the application, the length of the in situ plasma clean step, the RF power levels employed, the gases employed and other factors as would be understood by a person of skill in the art.

Figure 1B:
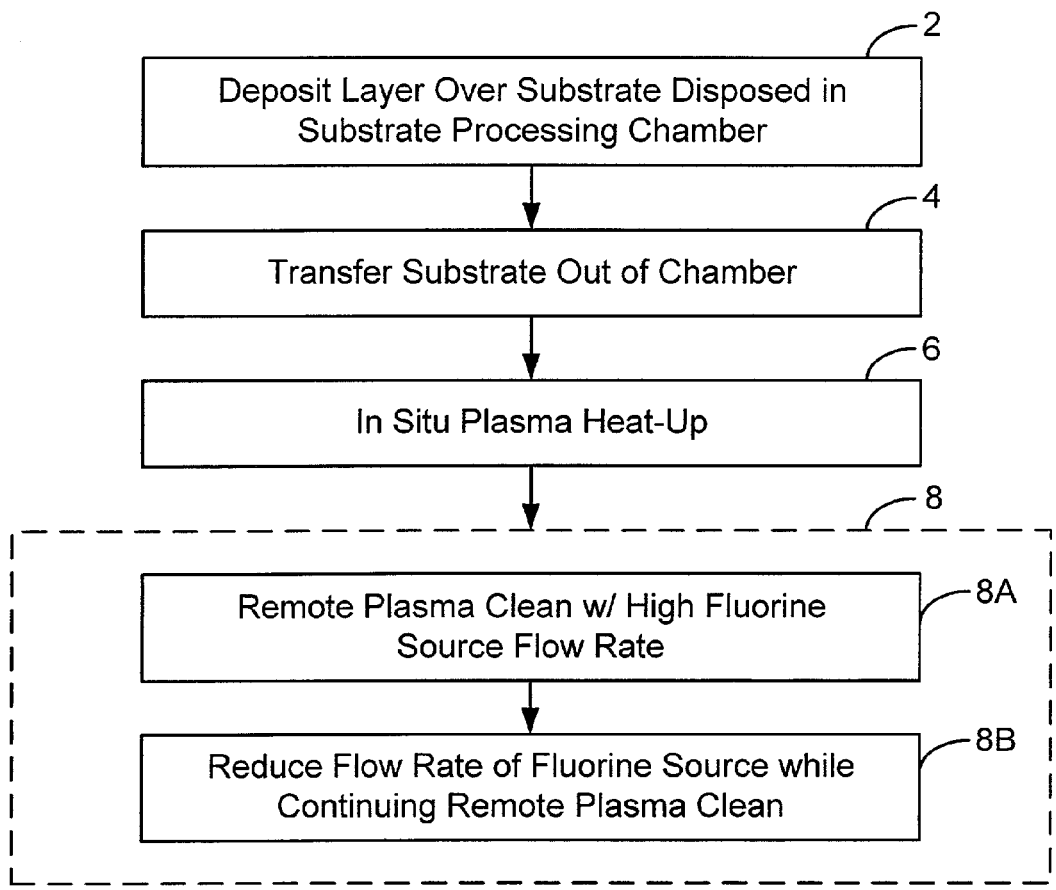
FIG. 1B is a flowchart depicting the steps associated with another embodiment of the present invention.

The steps of another embodiment of the invention that uses the principle depicted in FIG. 4 to further reduce the amount of clean gas needed in order to adequately clean the chamber are shown in the flow chart of FIG. 1B. The embodiment of FIG. 1B is similar to that of FIG. 1A except that remote plasma clean step 8 is divided into two separate steps 8A and 8B. The first step of this two step process, is a first remote plasma clean step in which the clean gas is flowed into the remote plasma generator at a first flow rate. Then, in subsequent step 8B, the flow rate of the remote plasma clean gas (e.g., a fluorine-containing etchant gas) is reduced and/or the chamber pressure is lowered. In some embodiments, the initiation of remote plasma clean step 8B corresponds generally to the diffusive dominating clean region (dividing time 20 in FIG. 4) so that the clean reaction rate can benefit from prolonged thermal effect of the plasm heat-up in combination with a chamber pressure effect.

Figure 5:
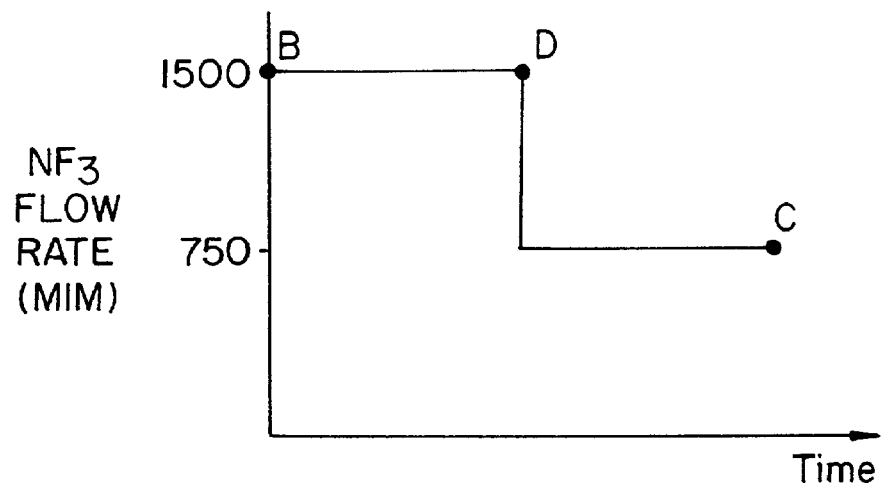
FIG. 5 is a graph illustrating an exemplary decrease in the flow rate of the etchant gas between remote plasma clean steps 8A and 8B in accordance with one embodiment of the invention.

FIG. 5 shows one example of such a two-step remote plasma clean where the flow rate of $NF_3$ is reduced by 50% approximately halfway through the remote clean process (Point D). In other embodiments the reduction of the etchant gas may occur prior to or after the halfway mark of the reaction. Also, in still other embodiments, the flow rate of the etchant gas may be stepped down from an initial high value to a final low value in multiple iterations. For example, in one embodiment, the flow rate may be successively reduced from 1000 sccm to 750 sccm to 500 sccm and then to 250 sccm before the clean process is completed. In FIG. 5, point B represents the start of remote plasma clean step 8 and point C represents the end of the remote plasma clean step.

Figure 6:
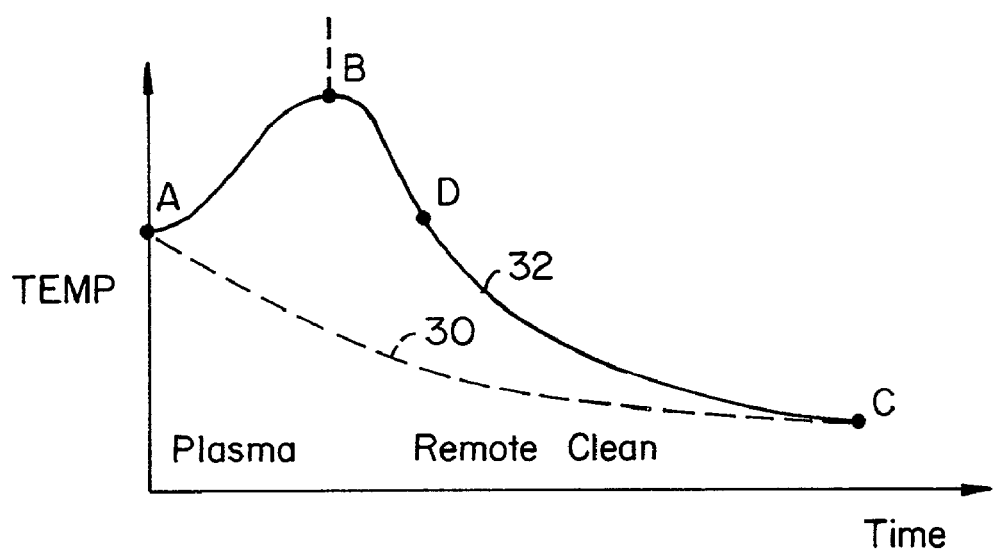
FIG. 6 is a graph comparing the temperature of the interior of a chamber cleaned according to a previously known remote plasma clean process with the temperature of the interior of the chamber cleaned in accordance with techniques of the present invention.

FIG. 6 shows one example of substrate processing chamber temperature as it varies over time from point A (the end of a deposition process), to point B (the end of the in situ plasma preheat step), to point C (the end of the remote clean process). In FIG. 6, line 30 represents a traditional remote plasma clean while line 32 represents a clean process according to one embodiment of the invention. As shown in FIG. 6, the 20–60 additional seconds required by the preheat step is generally saved because of the higher clean rate by the remote plasma clean process, i.e., both processes have approximately the same overall duration. Also shown in FIG. 6 along line 32 is the time D at which the flow rate of the clean gas may be reduced in accordance with some embodiments of the invention as explained with respect to FIGS. 4 and 5.

Embodiments of the present invention can be implemented using a variety of substrate processing chambers providing the chambers have the capability creating reactive etch species within the chamber by forming an etchant plasma within the chamber (an in situ plasma) and by transporting remotely dissociated reactive species into the chamber from a remote plasma source in fluid communication with the chamber. An example of an inductively-coupled HDP-CVD chamber in which some embodiments of the method of the present invention can be practiced is set forth below. It is to be understood that the following chamber description is for exemplary purposes only as the techniques of the present invention can be used in a variety of other plasma chambers including PECVD chambers and ECR-HDP chambers among others.

Figure 7A:
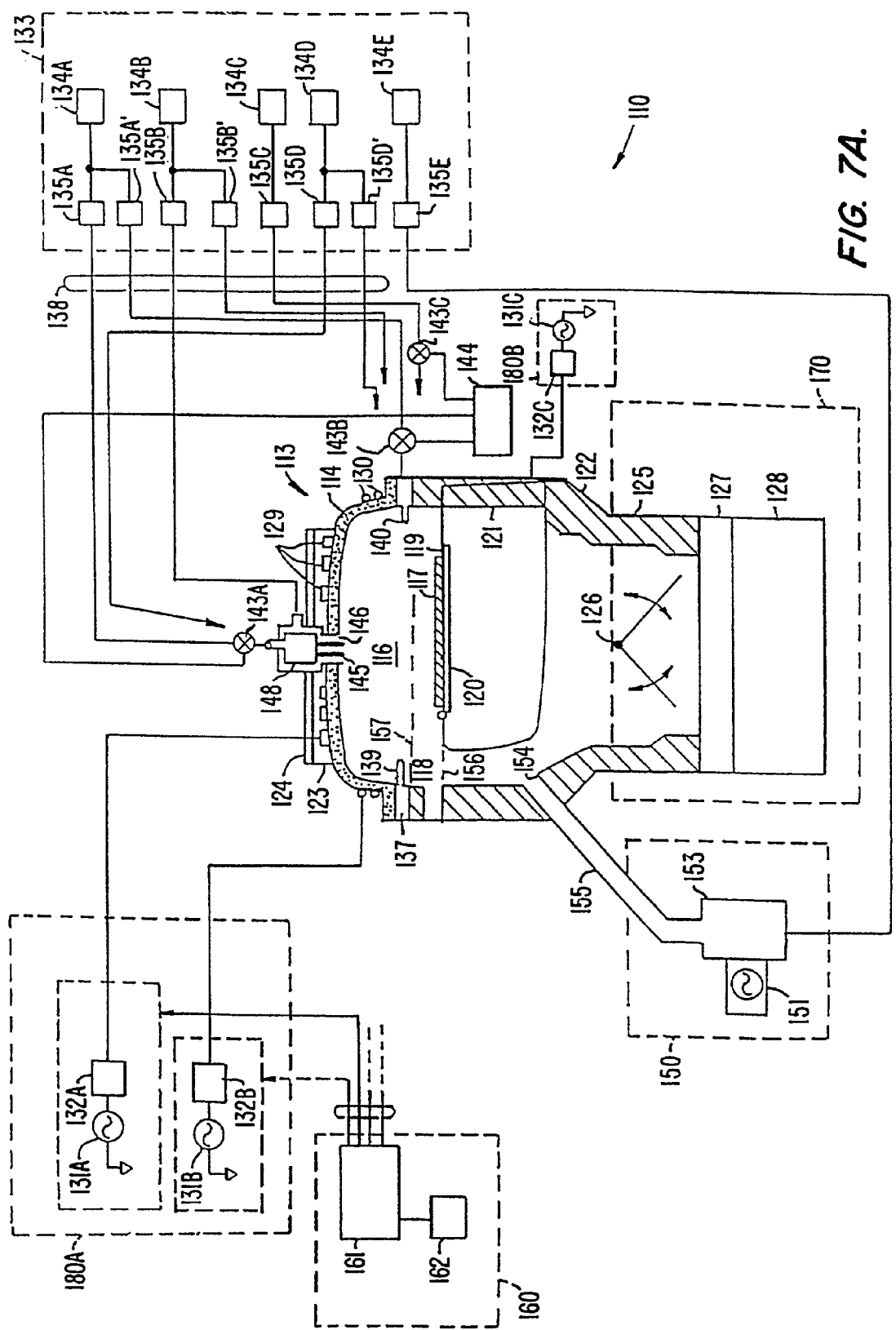
FIG. 7A is a simplified, cross-sectional view of an exemplary substrate processing system with which embodiments of the present invention may be used.

FIG. 7A illustrates one embodiment of a high density plasma chemical vapor deposition (HDP-CVD) system 110 in which the chamber cleaning techniques according to the present invention can be employed. System 110 includes a chamber 113, a substrate support 118, a gas delivery system 133, a remote plasma cleaning system 150, a vacuum system 170, a source plasma system 180A, a bias plasma system 180B.

The upper portion of chamber 113 includes a dome 114, which is made of a ceramic dielectric material, such as aluminum oxide or aluminum nitride. Dome 114 defines an upper boundary of a plasma processing region 116. Plasma processing region 116 is bounded on the bottom by the upper surface of a substrate 117 and a substrate support 118, which is also made from an aluminum oxide or aluminum ceramic material.

A heater plate 123 and a cold plate 124 surmount, and are thermally coupled to, dome 114. Heater plate 123 and cold plate 124 allow control of the dome temperature to within about ±10° C. over a range of about 100° C. to 200° C. Generally, exposure to the plasma heats a substrate positioned on substrate support 118. Substrate support 118 includes inner and outer passages (not shown) that can deliver a heat transfer gas (sometimes referred to as a backside cooling gas) to the backside of the substrate.

The lower portion of chamber 113 includes a body member 122, which joins the chamber to the vacuum system. A base portion 121 of substrate support 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support 118. Substrate receiving portion 119 includes an electrostatic chuck 120 that can be used to secure the substrate to substrate support 118 during substrate processing.

Vacuum system 170 includes throttle body 125, which houses twin-blade throttle valve 126 and is attached to gate valve 127 and turbo-molecular pump 128. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures as low as about 1 mTorr.

Source plasma system 180A is coupled to a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. In a specific embodiment, the top source RF generator 131A provides up to 2,500 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 180B includes a bias RF (BRF) generator 131C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. Matching networks 132A and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

A gas delivery system 133 provides gases from several sources 134(a) . . . 134(n) via gas delivery lines 138 (only some of which are shown). In the particular example illustrated below, gas sources 134(a) . . . 134(n) include separate sources for $SiH_4$, $O_2$, Ar and $NF_3$ as well as one or more sources for the extended cleaning process. As would be understood by a person of skill in the art, the actual sources used for sources 134(a) . . . 134(n) and the actual connection of delivery lines 138 to chamber 113 varies depending on the deposition and cleaning processes executed within chamber 113. Gas flow from each source 134(a) . . . 134(n) is controlled by one or more mass flow controllers (not shown) as is known to those of skill in the art.

Figure 7B:
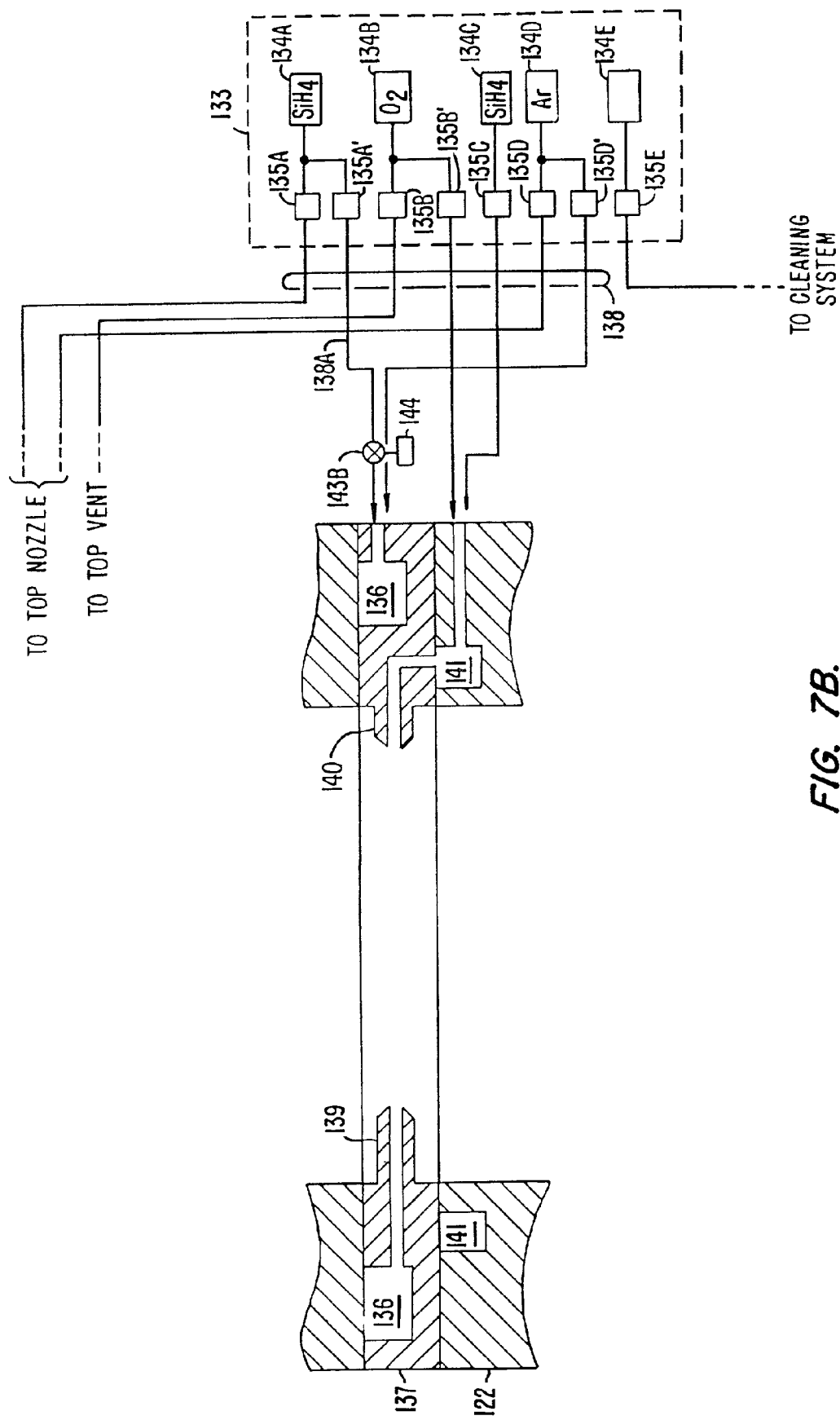
FIG. 7B is a simplified cross-sectional view of a gas ring that may be used in conjunction with the exemplary CVD processing chamber of FIG. 7A.

Gases are introduced into chamber 113 through a gas ring 137 and/or a top nozzle 145. FIG. 7B is a simplified, partial cross-sectional view of chamber 113 showing additional details of gas ring 137. In some embodiments, one or more gas sources provide gas to ring plenum 136 in gas ring 137 via gas delivery lines 138 (only some of which are shown). Gas ring 137 has a plurality of gas nozzles 139 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one specific embodiment, gas ring 137 has 24 (twenty-four) gas nozzles 139 made from an aluminum oxide ceramic.

Gas ring 137 also has a plurality of gas nozzles 140 (only one of which is shown), which in a specific embodiment are co-planar with and shorter than source gas nozzles 139, and in one embodiment receive gas from body plenum 141. Gas nozzles 139 and 140 are not fluidly coupled in some embodiments where it is desirable to not mix gases (e.g., $SiH_4$ and $O_2$) introduced through gas ring 137 before injecting the gases into chamber 113. In other embodiments, gases may be mixed prior to injecting the gases into chamber 113 by providing apertures (not shown) between body plenum 141 and gas ring plenum 136. Additional valves, such as 143B (other valves not shown), may shut off gas from the flow controllers to the chamber.

In embodiments where flammable, toxic, or corrosive gases are used, it may be desirable to eliminate gas remaining in the gas delivery lines after a deposition or cleaning process. This may be accomplished using a 3-way valve, such as valve 143B, to isolate chamber 113 from a delivery line 138 and to vent delivery line 138 to vacuum foreline 144, for example. As shown in FIG. 7A, other similar valves, such as 143A and 143C, may be incorporated on other gas delivery lines. Such 3-way valves may be placed as close to chamber 113 and remote plasma source 150 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 7A, chamber 113 also has top nozzle 145 and top vent 146. Top nozzle 145 and top vent 146 allow independent control of top and side flows of the gases, which improves film uniformity and allows fine adjustment of the film's deposition and doping parameters. Top vent 146 is an annular opening around top nozzle 145. In one embodiment, one source, e.g., $SiH_4$, supplies source gas nozzles 139 and top nozzle 145 through separate MFCs (not shown). Similarly, separate MFCs may be used to control the flow of oxygen to both top vent 146 and gas nozzles 140 from a single source of oxygen. The gases supplied to top nozzle 145 and top vent 146 may be kept separate prior to flowing the gases into chamber 113, or the gases may be mixed in top plenum 148 before they flow into chamber 113. In other embodiments, separate sources of the same gas may be used to supply various portions of the chamber.

A remote plasma cleaning system, such as a microwave plasma source 150 (or a torodial plasma source in other embodiments), is provided to periodically clean deposition residues from chamber components in a dry cleaning operation. The cleaning system includes a remote plasma generator 151 that creates a plasma from one or more cleaning gas source in sources 134(a) . . . 134(n) (e.g., molecular fluorine, nitrogen trifluoride, other fluorocarbons or equivalents alone or in combination with another gas such as Argon) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

System controller 160 controls the operation of system 110. Controller 160 may include, for example, a memory 162, such as a hard disk drive and/or a floppy disk drive and a card rack coupled to a processor 161. The card rack may contain a single-board computer (SBC), analog and digital input/output boards, interface boards and stepper motor controller boards. System controller 160 operates under the control of a computer program stored on the hard disk drive or through other computer programs, such as programs stored on a removable disk. The computer program dictates, for example, the timing, mixture of gases, RF power levels and other parameters of a particular process.

To validate the in situ plasma heat-up remote clean process just described, a 500-wafer marathon was run to check in-film particles, the direction indication of clean effectiveness, in an Ultima HDP-CVD chamber. The total clean time was 180 seconds including a 40 second in situ plasma heat-up step, a first 60 second remote plasma clean step and a second 80 second remote plasma clean step. Gas flow rates and other parameters used for the chamber clean portion of the 500 wafer marathon test are set forth below in Table 1. In Table 1, "TVO" means throttle valve fully open so that chamber pressure is controlled by the gas flow rate into the chamber.

TABLE 1

500 WAFER MARATHON TEST

| Parameter | Heat-up Step | Clean Step 1 | Clean Step 2 |
|---|---|---|---|
| Gas | Ar (side) 300 sccm<br>Ar (top) 30 sccm | $NF_3$<br>1500 sccm | $NF_3$ 500 sccm |
| Plasma Power | Top Coil 3000 W (RF)<br>Side Coil 4000 W (RF) | 3200 W (MW) | 2800 W (MW) |
| Pressure | 5 mTorr | 3.0 Torr | TVO<br>750 mTorr |
| Time | 40 sec | 60 sec | 80 sec |

Figure 8:
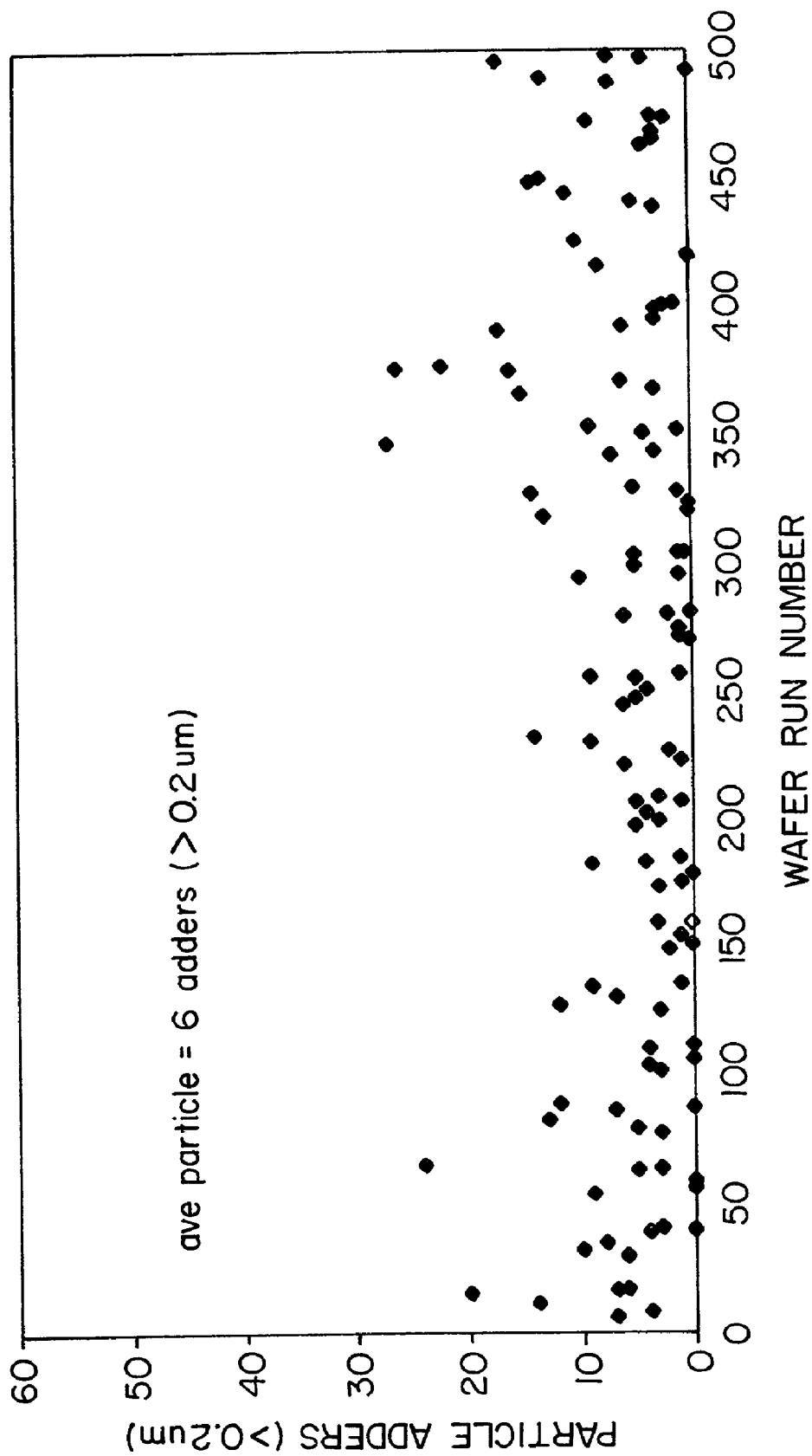
FIG. 8 is a graph depicting test results in accordance with one embodiment of the present invention.
Figure 9:
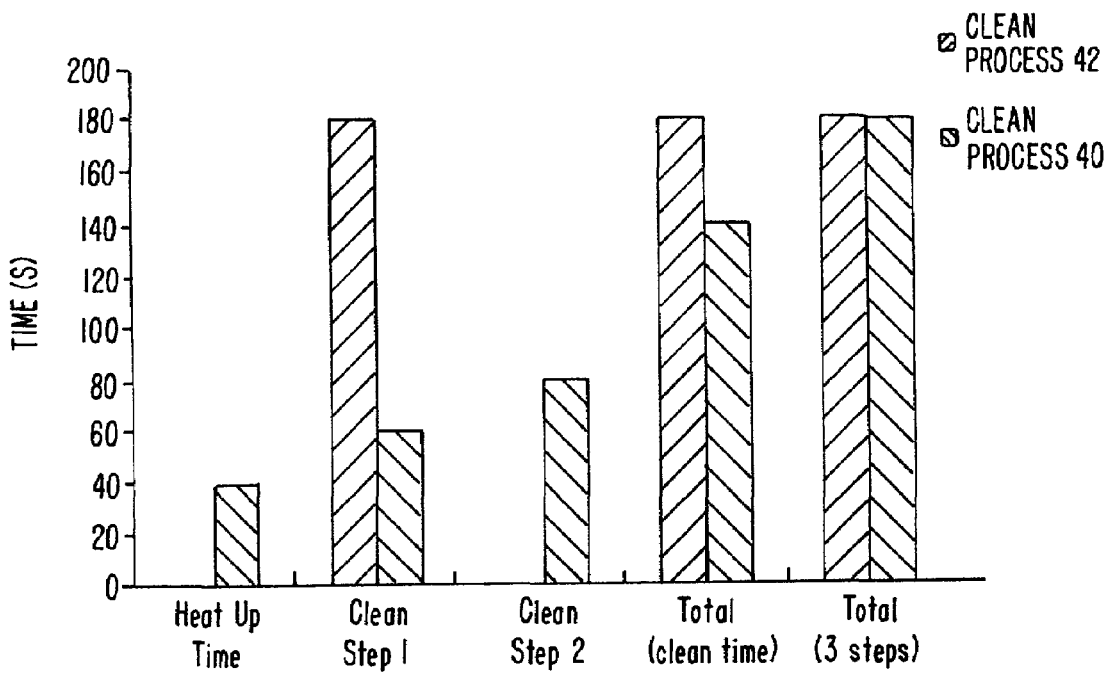
FIGS. 9 and 10 are bar graphs comparing the length of time and total $NF_3$ usage, respectively, of a clean process in accordance with the present invention with a previously known remote plasma clean process.

FIG. 8 shows that the average in-film particle adder is 6 for particle size greater than 0.2 microns. This particle performance is equivalent to that achieved by a previously used 180 second remote plasma chamber clean process that did not use the in situ plasma heat-up step according to the present invention. FIG. 9 is a bar graph that compares the timing of the various steps associated with the chamber cleaning process according to the present invention used in 500 wafer marathon test (process 40) with those associated with the previously used remote plasma chamber cleaning process (process 42). As is evident from FIG. 9, even though process 40 includes an additional 40 second in situ plasma heat-up step, the total time required for each of processes 40 and 42 is equivalent.

Figure 10:
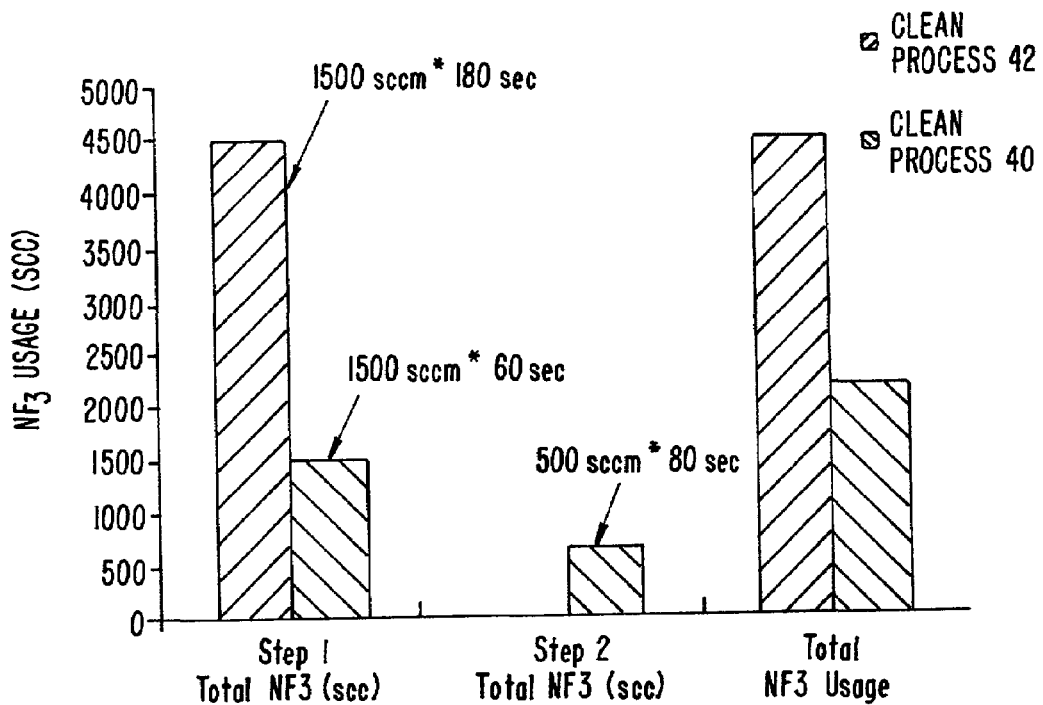

FIG. 10 is a graph comparing the total amount of $NF_3$ used in each of processes 40 and 42 in order to achieve substantially the same results. As shown in FIG. 10, process 42, which does not use the techniques of the present invention, uses a total volume of 4500 standard cubic centimeters (scc) of $NF_3$. Process 40, on the other hand, which is in accordance with the techniques of the present invention, uses approximately 2200 scc of $NF_3$—a 52% reduction as compared to the previously used process 42.

Having fully described several embodiments of the present invention, many other equivalents or alternative embodiments of the present invention will be apparent to those skilled in the art. For example, while the invention was described with respect to cleaning CVD chambers it may also be used to clean other types of chambers, including etch chambers, where appropriate. Also, why the examples set forth above all used $NF_3$ as the etchant gases other etchant gases may be used in other embodiments. As such, the above description is illustrative and not restrictive. These equivalents and/or alternatives are intended to be included within the scope of the present invention.

What is claimed is:

1. A process for removing unwanted deposition build-up from one or more interior surfaces of a substrate processing chamber after processing a substrate disposed in the substrate processing chamber, said process comprising:
   transferring said substrate out of the chamber;
   flowing a first gas into the substrate processing chamber and forming a plasma within the substrate processing chamber from the first gas to heat the chamber from a first temperature to a second, higher temperature;
   thereafter, extinguishing the plasma, flowing an etchant gas into a remote plasma source, forming reactive species from the etchant gas and transporting the reactive species into the substrate processing chamber to etch the unwanted deposition build-up while allowing the chamber to drop to a temperature below the second temperature.

2. The process of claim 1 wherein the first gas consists of an inert gas.

3. The process of claim 1 wherein the first gas consists of an oxygen-containing source and/or an inert gas.

4. The process of claim 1 wherein the remote plasma source is a microwave plasma source.

5. The process of claim 1 wherein the remote plasma source is a toroidal plasma source.

6. The process of claim 1 wherein the step of forming the plasma within the chamber heats an interior surface of the chamber to a temperature of at least 400° C.

7. The process of claim 1 wherein the substrate processing chamber is a CVD chamber.

8. The process of claim 1 wherein the etchant gas comprises $NF_3$.

9. A process for removing unwanted deposition build-up from one or more interior surfaces of a substrate processing chamber after depositing a layer of material over a substrate disposed in the substrate processing chamber, said process comprising:
   transferring the substrate out of the chamber;
   flowing an inert gas into the substrate processing chamber;
   forming a plasma from the inert gas within the substrate processing chamber to heat the chamber;
   thereafter, extinguishing the plasma, flowing an etchant gas into a remote plasma source at a first flow rate, forming reactive species from the etchant gas and transporting the reactive species into the substrate processing chamber to etch a first portion of the unwanted deposition build-up; and
   thereafter, decreasing the flow rate of the etchant gas into the remote plasma source while continuing to transport reactive species formed from the etchant gas into the substrate processing chamber to etch a second portion of the unwanted deposition build-up.

10. The process of claim 9 wherein the inert gas is argon.

11. The process of claim 9 wherein the step of flowing an inert gas into the chamber further comprises flowing an oxygen-containing gas into the chamber.

12. The process of claim 9 wherein the remote plasma source is a microwave plasma source.

13. The process of claim 9 wherein the remote plasma source is a toroidal plasma source.

14. The process of claim 9 wherein the step of forming the plasma within the chamber heats an interior surface of the chamber to a temperature of at least 400C.

15. A process for removing unwanted deposition build-up from one or more interior surfaces of a substrate processing chamber after processing a substrate disposed in the substrate processing chamber, the process comprising:
   transferring the substrate out of the chamber;
   heating the substrate processing chamber by forming a plasma within the substrate processing chamber from a gas consisting essentially of inert gas constituents and/or or and an oxygen-containing source to increase a surface temperature of the unwanted deposition build-up;
   extinguishing the plasma within the chamber; and
   removing the unwanted deposition build-up from one or more interior surfaces of a substrate processing chamber by flowing an etchant gas into a remote plasma source, forming reactive species from the etchant gas and transporting the reactive species into the substrate processing chamber.

16. The process of claim 15 wherein a temperature of the substrate processing chamber increases during the step of heating the chamber and decreases during the step of removing the unwanted deposition build-up.

17. The process of claim 16 further comprising, prior to transferring the substrate out of the chamber, depositing a layer of material over the substrate, wherein the step of heating the chamber increases the temperature of the chamber to a temperature beyond the temperature reached during the depositing step.

18. The process of claim 15 wherein the step of removing the unwanted deposition build-up comprises a phase in which a reaction between the reactive species and deposition build-up is mass transport limited followed by a phase in which a reaction between the reactive species and deposition build-up is surface reaction limited.

19. The process of claim 15 wherein the etchant gas comprises a fluorine source.

20. The process of claim 19 wherein the fluorine source comprises nitrogen trifluoride.

21. The process of claim 1 wherein the plasma formed from the first gas is formed by applying RF energy to a portion of the chamber.

22. The process of claim 1 wherein the first gas consists of an oxygen-containing source.

23. The process of claim 9 wherein a temperature of the substrate processing chamber increases during the step of forming a plasma within the substrate processing chamber and decreases while reactive species from the remote plasma source etch the first portion of the unwanted deposition build-up.

* * * * *